(12) United States Patent
Yamauchi

(10) Patent No.: US 7,459,244 B2
(45) Date of Patent: Dec. 2, 2008

(54) MASK, METHOD FOR FORMING A PATTERN, AND METHOD FOR EVALUATING PATTERN LINE WIDTH

(75) Inventor: Satoshi Yamauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 672 days.

(21) Appl. No.: 10/992,743

(22) Filed: Nov. 22, 2004

(65) Prior Publication Data

US 2006/0008708 A1    Jan. 12, 2006

(30) Foreign Application Priority Data

Jul. 12, 2004    (JP)    ............................. 2004-204052

(51) Int. Cl.
*G03F 1/00*    (2006.01)
*G03C 5/02*    (2006.01)

(52) U.S. Cl. ............................................ 430/5; 430/30
(58) Field of Classification Search ...................... 430/5, 430/30
See application file for complete search history.

(56) References Cited

U.S. PATENT DOCUMENTS 6,391,501 B1 *    5/2002  Ohnuma ....................... 430/22
6,570,157 B1 *    5/2003  Singh et al. .................. 250/311
6,982,135 B2 *    1/2006  Chang et al. ..................... 430/5
2006/0008709 A1 *    1/2006  Kushida et al. ................. 430/5

FOREIGN PATENT DOCUMENTS

JP          08-288352          11/1996

* cited by examiner

*Primary Examiner*—Mark F Huff
*Assistant Examiner*—Jonathan Jelsma
(74) *Attorney, Agent, or Firm*—Westerman, Hattori, Daniels & Adrian, LLP.

(57)    ABSTRACT

A mask having a mask pattern for properly evaluating pattern line width. A mask pattern including a pattern to be determined and a plurality of surrounding patterns is formed on a mask. Areas with the same line width in the pattern to be determined are located between a pair of surrounding patterns with an aperture rate of 0%, between a pair of surrounding patterns with an aperture rate of 50%, and between a pair of surrounding patterns with an aperture rate of 100%, respectively. These pairs of surrounding patterns with the different aperture rates change the influence of charge-up on the pattern to be determined. Accordingly, the line width of each area in the pattern to be determined is determined, the difference between the line width of two areas is found, and the amount of a determination error caused by the charge-up is calculated. As a result, whether the line width of the pattern is determined with accuracy can be judged and the line width of the pattern can be evaluated properly.

7 Claims, 10 Drawing Sheets

MASK, METHOD FOR FORMING A PATTERN, AND METHOD FOR EVALUATING PATTERN LINE WIDTH

CROSS-REFERENCE TO RELATED APPLICATIONS

This application is based upon and claims the benefits of priority from the prior Japanese Patent Application No. 2004-204052, filed on Jul. 12, 2004, the entire contents of which are incorporated herein by reference.

BACKGROUND OF THE INVENTION (1) Field of the Invention

This invention relates to a mask, a method for forming a pattern, and a method for evaluating the line width of a pattern and, more particularly, to a mask used for evaluating the line width of a mask pattern formed on a photo mask, a method for forming such a pattern, and a method for evaluating the line width of such a pattern.

(2) Description of the Related Art

Control of the line width, such as the gate line width, of circuit patterns in semiconductor devices is very important in fabricating them. To form a circuit pattern, a photo mask where a mask pattern which is usually four or five times the size of the circuit pattern is formed is used. This mask pattern is reduced and transferred onto a wafer by exposure. Accordingly, when a photo mask is fabricated, the line width of a mask pattern formed on it must be accurate.

For example, with an ordinary binary photo mask, a light shielding pattern is formed on a silica substrate with a film of metal, such as chromium (Cr) or molybdenum silicide (MoSi). That is to say, light transmitting portions which transmit light at exposure time and light shielding portions which shield light at exposure time are formed.

In recent years circuit patterns in semiconductor devices have become minuter, so mask patterns formed on photo masks have also become minuter. In many cases, scanning electron microscopes (SEMs) are used for checking whether such minute patterns are formed on photo masks with great accuracy.

However, photo masks are insulating silica substrates on which a conductive metal film is formed. Therefore, when the line width of a mask pattern is determined with a SEM, the influence of secondary electrons emitted from the surface of the photo mask changes due to a change in the aperture rate or covering rate of the mask pattern in an area near a portion where determination is made, and a charge-up of insulating portions often occurs. As a result, a SEM image which is being observed may gradually shift, that is to say, what is called a flicker of a SEM image may occur or the mask pattern may look to be expanded. In many cases, this causes an error in the line width of the mask pattern determined on the basis of the SEM image.

Conventionally, various methods have been proposed to solve problems caused by charge-up which occurs at the time of using a SEM. For example, a method for using a sample on which insulating patterns with known line width are formed alternately with conductive patterns with known line width and for clarifying the limitations of determination of line width by a SEM according to the amount of a change in the line width of the insulating patterns in respect to the line width of the conductive patterns at the time of observation by the SEM is proposed (see, for example, Japanese Unexamined Patent Publication No. Hei 8-288352).

SUMMARY OF THE INVENTION

A mask with a mask pattern including a pattern to be determined the line width of which is to be determined and a plurality of surrounding patterns formed near the pattern to be determined is provided by the present invention. On this mask, each of a plurality of areas with same line width, the pattern to be determined being located in the plurality of areas, is located between a pair of surrounding patterns with a same aperture rate of the plurality of surrounding patterns and an aperture rate of a pair of surrounding patterns between which one of the plurality of areas is located differs from an aperture rate of a pair of surrounding patterns between which another one of the plurality of areas is located.

Furthermore, a patterning method for forming a pattern is provided by the present invention. This patterning method comprises forming a pattern to be determined the line width of which is to be determined and forming a pair of surrounding patterns with a same aperture rate near the pattern to be determined after the formation of the pattern to be determined, an area with constant line width being located between the pair of surrounding patterns, the pattern to be determined being located in the area.

In addition, a pattern line width evaluation method for evaluating the line width of a pattern is provided by the present invention. This pattern line width evaluation method comprises forming a plurality of pairs of surrounding patterns each of which have a same aperture rate, each of a plurality of areas with same line width is located between each of the plurality of pairs of surrounding patterns, a pattern to be determined the line width of which is to be determined being located in the plurality of areas; determining line width of the pattern to be determined in each of the plurality of areas located between each of the plurality of pairs of surrounding patterns by using an electron microscope; and using the line width of one area of the plurality of areas as a standard, comparing the line width of another area of the plurality of areas with the line width of the one area of the plurality of areas, and finding the amount of a determination error in the line width of the another area of the plurality of areas caused by charge-up.

The above and other features and advantages of the present invention will become apparent from the following description when taken in conjunction with the accompanying drawings which illustrate preferred embodiments of the present invention by way of example.

BRIEF DESCRIPTION OF THE DRAWINGS

FIG. 8 is a view showing results obtained by determining the line width of an area a.

DESCRIPTION OF THE PREFERRED EMBODIMENTS

Conventionally, whether charge-up influences a result obtained by determining the line width of a mask pattern formed on a photo mask has not been considered. Furthermore, the amount of a determination error caused by charge-up has conventionally not been found quantitatively. Accordingly, even if charge-up has an influence on the determination of the line width, it is impossible to recognize the extent of the influence. Therefore, when the line width of a mask pattern is evaluated, the line width may or may not be determined accurately. It is difficult to judge whether the line width of the pattern is evaluated properly.

The present invention was made to solve such a problem. An object of the present invention is to provide a mask having a mask pattern for properly evaluating the line width of a pattern and a method for forming such a pattern.

Another object of the present invention is to provide a pattern line width evaluation method for properly evaluating the line width of a pattern by considering the amount of a determination error caused by charge-up.

Embodiments of the present invention will now be described in detail with reference to the drawings in connection with a case in which the line width of a pattern formed on a photo mask is evaluated.

A mask pattern used for evaluating the line width of a pattern formed on a photo mask will be described first.

Figure 1:
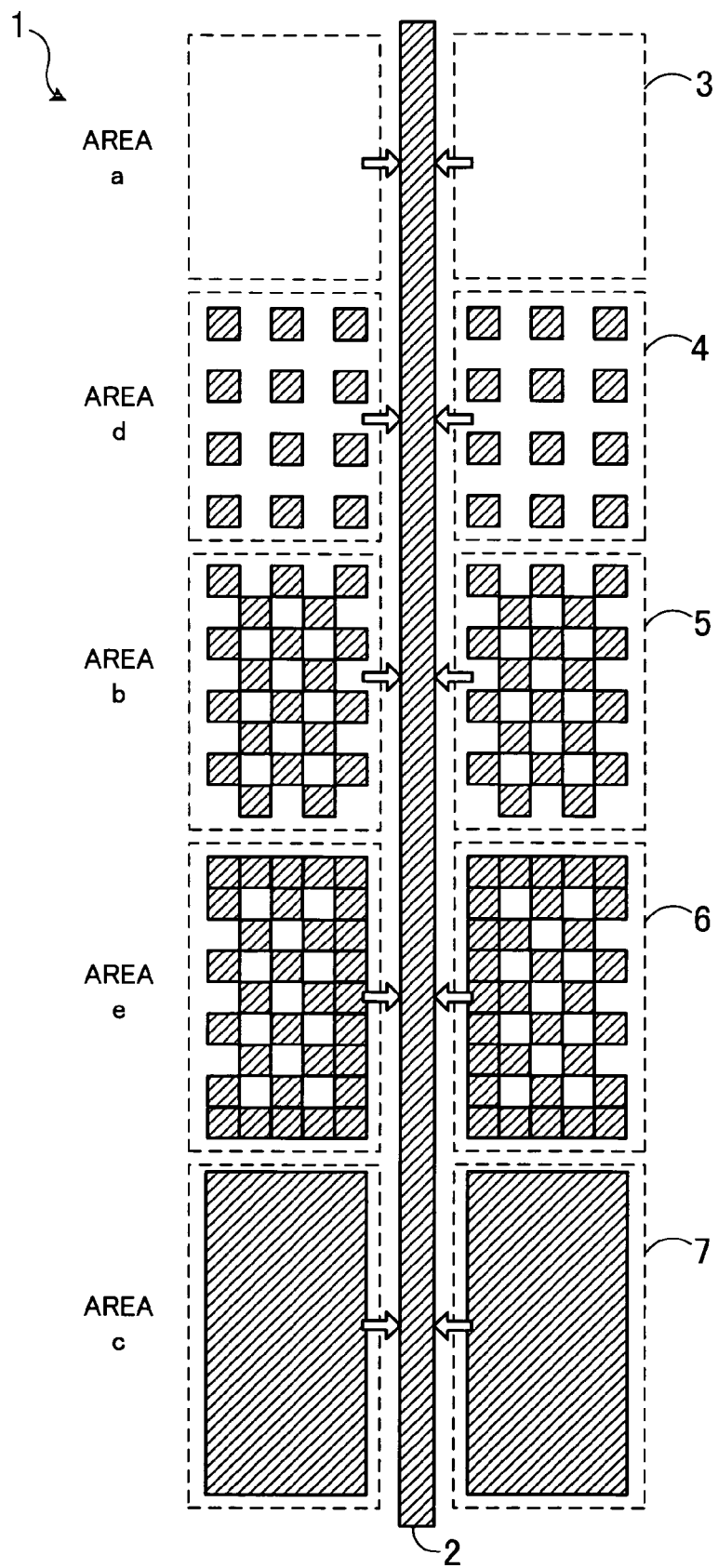
FIG. 1 shows an example of the structure of a mask pattern.

FIG. 1 shows an example of the structure of a mask pattern.

With a mask pattern 1 shown in FIG. 1, a light shielding pattern is formed on, for example, a silica substrate by a film of metal, such as chromium. By doing so, light transmitting portions and light shielding portions are formed. A straight light transmitting portion with the same line width is formed in the middle of the mask pattern 1 as a pattern 2 to be determined. Five surrounding patterns 3, 4, 5, 6, and 7 which differ in aperture rate (ratio of light transmitting portions to a certain area) are formed on both sides of the pattern 2 to be determined.

The aperture rates of the five surrounding patterns 3, 4, 5, 6, and 7 are 0%, 25%, 50%, 75%, and 100% respectively. In the surrounding patterns 4, 5, and 6, light transmitting portions and light shielding portions are arranged so as to make up a mosaic. This does not apply to the surrounding pattern 3 with an aperture rate of 0% or the surrounding pattern 7 with an aperture rate of 100%. There are two surrounding patterns with the same aperture rate and they are a pair. Accordingly, a pair of surrounding patterns 3, a pair of surrounding patterns 4, a pair of surrounding patterns 5, a pair of surrounding patterns 6, and a pair of surrounding patterns 7 are arranged with the pattern 2 to be determined between. The five surrounding patterns 3, 4, 5, 6, and 7 are arranged in ascending order of aperture rate. The surrounding pattern 3 with an aperture rate of 0% has only light shielding portions, but it is considered to be one of the surrounding patterns.

The mask pattern 1 is formed on a photo mask by itself or together with a mask pattern for a circuit pattern to be transferred onto a wafer. Furthermore, the surrounding patterns 3, 4, 5, 6, and 7 with the different aperture rates may be formed on both sides of the pattern 2 to be determined used as part of the mask pattern for the circuit pattern.

A method for forming the mask pattern 1 having such a structure will now be described.

Figure 2:
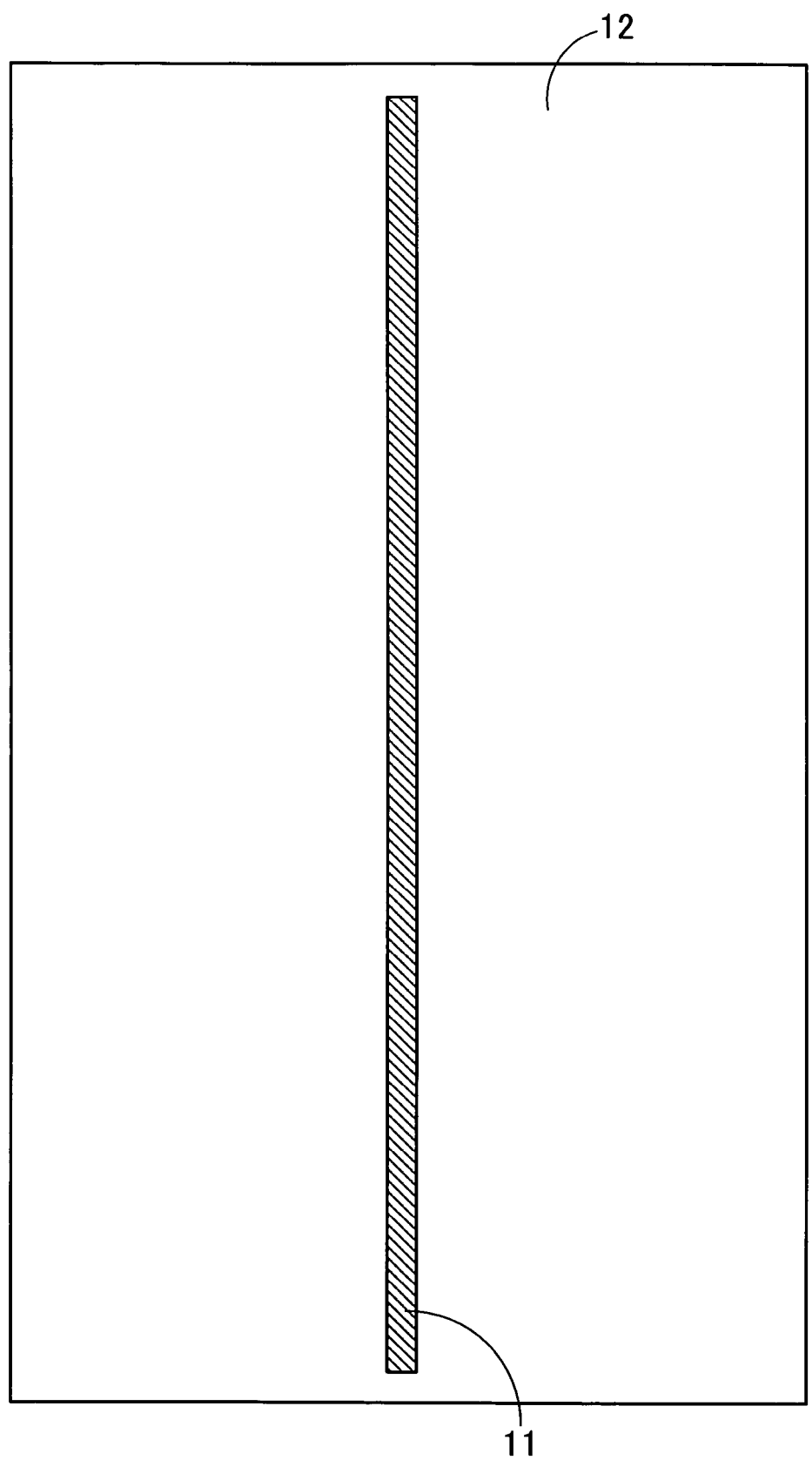
FIG. 2 is a plan of a mask in a first resist patterning process.
Figure 3:
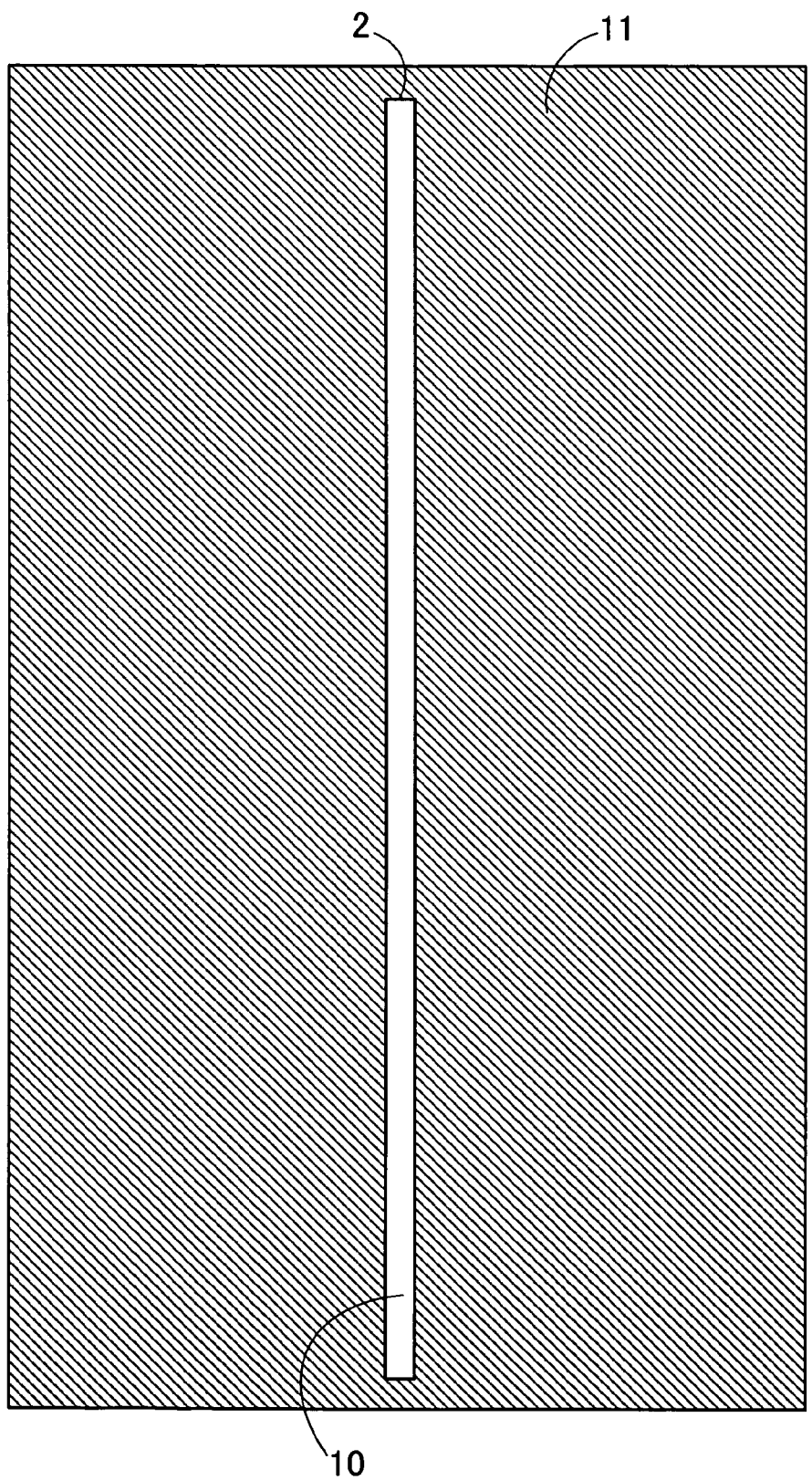
FIG. 3 is a plan of a mask in a first etching process.
Figure 4:
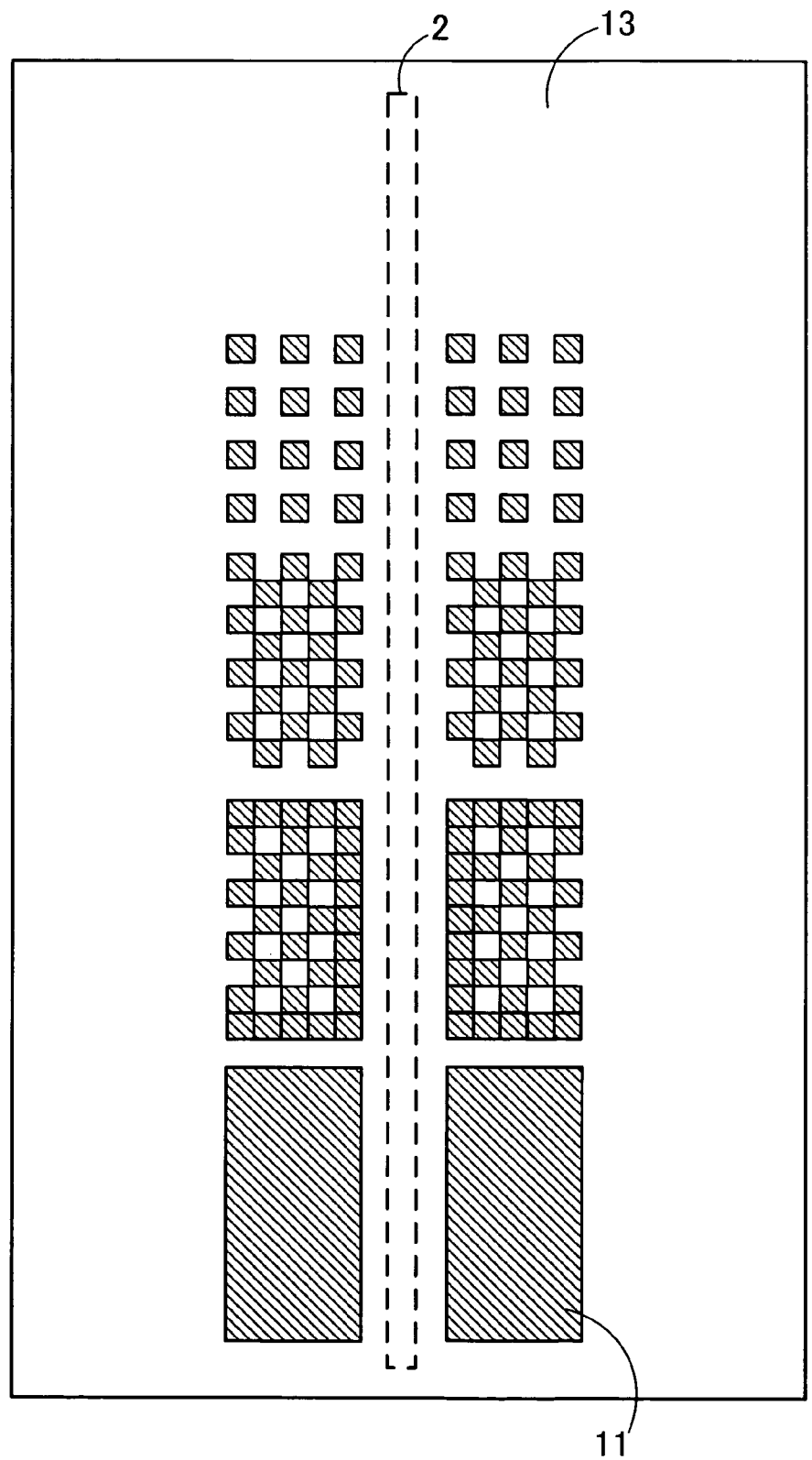
FIG. 4 is a plan of a mask in a second resist patterning process.
Figure 5:
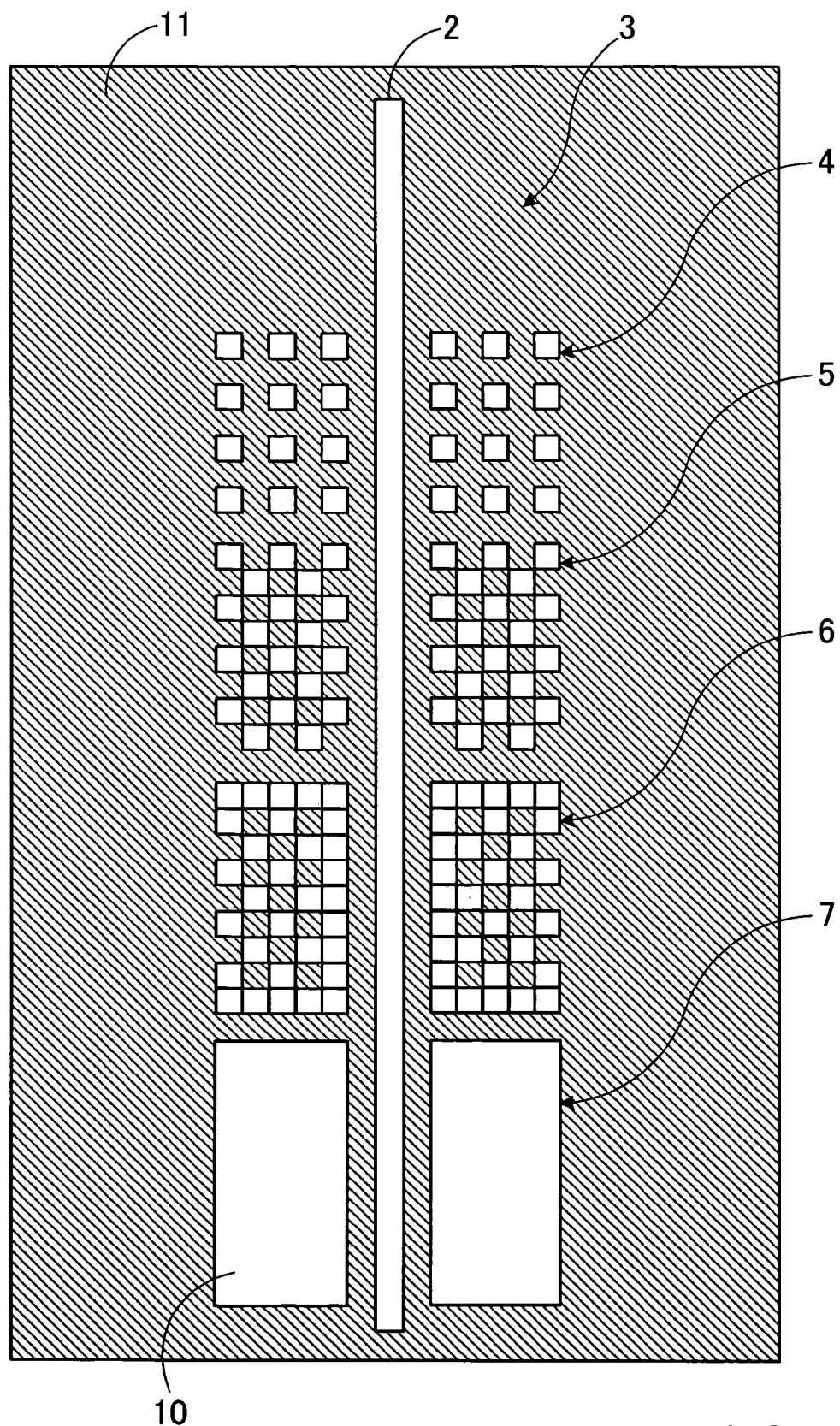
FIG. 5 is a plan of a mask in a second etching process.

FIGS. 2 through 5 are views for describing an example of a patterning method. FIG. 2 is a plan of a mask in a first resist patterning process. FIG. 3 is a plan of a mask in a first etching process. FIG. 4 is a plan of a mask in a second resist patterning process. FIG. 5 is a plan of a mask in a second etching process.

The patterning method shown in FIGS. 2 through 5 can be broadly divided into a first process (pattern-to-be-determined formation process) for forming the central pattern 2 to be determined and a second process (surrounding pattern formation process) for forming the surrounding patterns 3, 4, 5, 6, and 7 on both sides of the pattern 2 to be determined.

In the first process, a silica substrate about 154 millimeters square and about 6 millimeters thick, for example, is used as a mask substrate 10 of a photo mask on which the mask pattern 1 is to be formed, and a metal film 11 of Cr or MoSi having predetermined thickness is formed on the entire surface of the silica substrate. If Cr is used for forming the metal film 11, its thickness may be about 73 or 105 nm. If MoSi is used for forming the metal film 11, its thickness may be about 70 or 95 nm. That is to say, the thickness of the metal film 11 can be changed according to the type of the photo mask or the type of metal used.

After the metal film 11 is formed, the entire surface of the mask substrate 10 is coated with a resist. Then exposure and development are performed on the resist. As a result, a resist pattern 12 for forming the pattern 2 to be determined with, for example, a line width of about 400 nm and a length of about 3 μm is formed as shown in FIG. 2.

After the resist pattern 12 is formed, the metal film 11 is etched to expose a portion of the mask substrate 10. Then the resist is stripped. As a result, the pattern 2 to be determined is formed as shown in FIG. 3. At this time there is no other opening in the metal film 11 near the pattern 2 to be determined, so the pattern 2 to be determined can be formed with great accuracy in line width. That is to say, the pattern 2 to be determined can be formed so that line width will be constant in every area in the pattern 2 to be determined which extends straight.

In the following second process, the entire surface of the mask substrate 10 on which the pattern 2 to be determined has been formed is coated with a resist and exposure and development are performed on the resist. This is the same with the first process. As a result, as shown in FIG. 4, a resist pattern 13 for forming the surrounding patterns 4, 5, 6, and 7 (the surrounding pattern 3 with an aperture rate of 0% is not included) is formed on both sides of the pattern 2 to be determined covered with the resist.

Finally, the metal film 11 is etched to form openings there. Then the resist is stripped. As a result, the surrounding patterns 3, 4, 5, 6, and 7 are formed as shown in FIG. 5. The openings in the metal film 11 which expose the mask substrate 10 function as light transmitting portions of the photo mask and portions covered with the metal film 11 function as light shielding portions of the photo mask.

As stated above, by forming the pattern 2 to be determined and the surrounding patterns 3, 4, 5, 6, and 7 through the different patterning processes, the pattern 2 to be determined can be formed with great accuracy in line width. This means that the pattern 2 to be determined with constant line width can be formed nearly to design. Accordingly, the line width of the pattern 2 to be determined straight formed is constant in all of areas located between the surrounding patterns 3, between the surrounding patterns 4, between the surrounding patterns 5, between the surrounding patterns 6, and between the surrounding patterns 7.

A pattern line width evaluation method using the mask pattern 1 having the above structure will now be described.

To calculated the amount of a determination error caused by charge-up which occurs at the time of observation with a SEM, the line width of the pattern 2 to be determined included in the mask pattern 1 formed on the photo mask is determined first by observation with the SEM. The photo mask includes insulating portions (light transmitting portions) and conductive portions (light shielding portions). Therefore, in this case, charge-up may occur in the insulating portions, depending on conditions under which the observation is made.

Conventional pattern line width evaluations will now be described first in brief with reference to FIGS. 6 and 7.

Figure 6A:
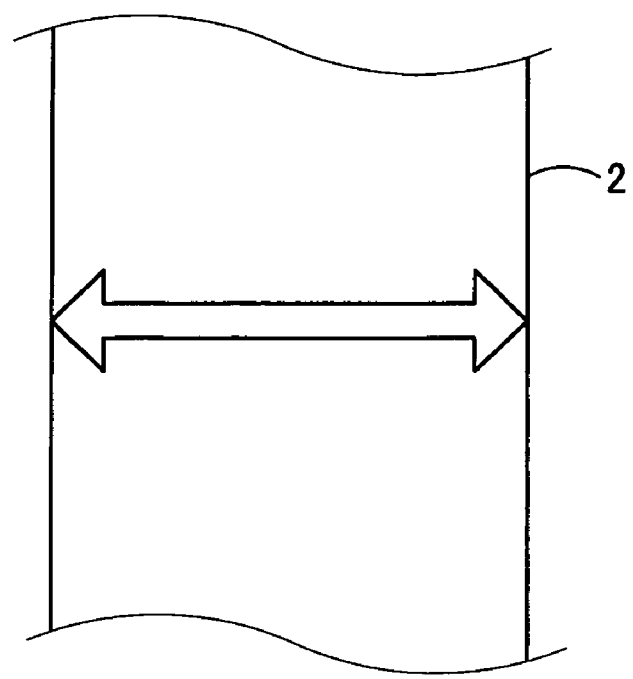
FIGS. 6A and 6B are views for describing the relationship between line width to be determined and charge-up, FIG. 6A showing a case where charge-up does not occur, FIG. 6B showing a case where charge-up occurs.
Figure 6B:
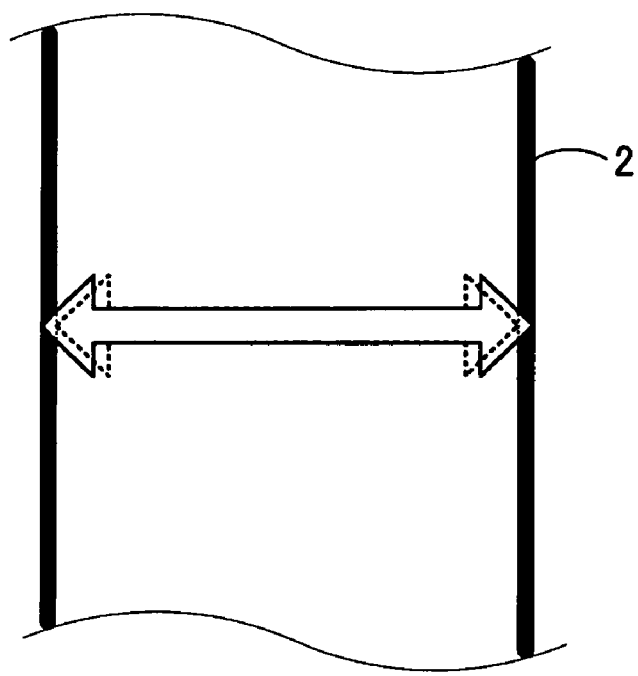

FIGS. 6A and 6B are views for describing the relationship between line width to be determined and charge-up. FIG. 6A shows a case where charge-up does not occur. FIG. 6B shows a case where charge-up occurs.

If charge-up does not occur in the surface of the photo mask at the time of the observation of the pattern 2 to be determined with the SEM, then the pattern edges of the pattern 2 to be determined are thin and clear as shown in FIG. 6A.

However, if charge-up occurs in the surface of the photo mask, then the pattern edges of the pattern 2 to be determined look thick and unclear as shown in FIG. 6B. As a result, the border of the pattern 2 to be determined (border between the light transmitting portion and the light shielding portion) becomes indistinct. This contributes to an error in determination of the line width of the pattern 2 to be determined.

Figure 7A:
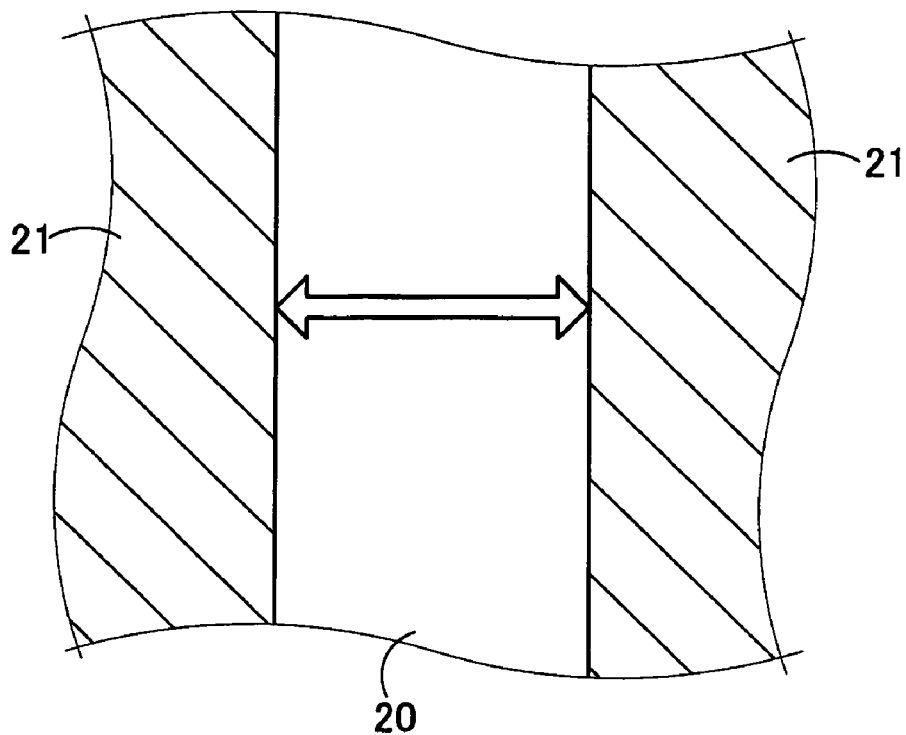
FIGS. 7A and 7B are views for describing determination of line width, FIG. 7A showing space determination, FIG. 7B showing line determination.
Figure 7B:
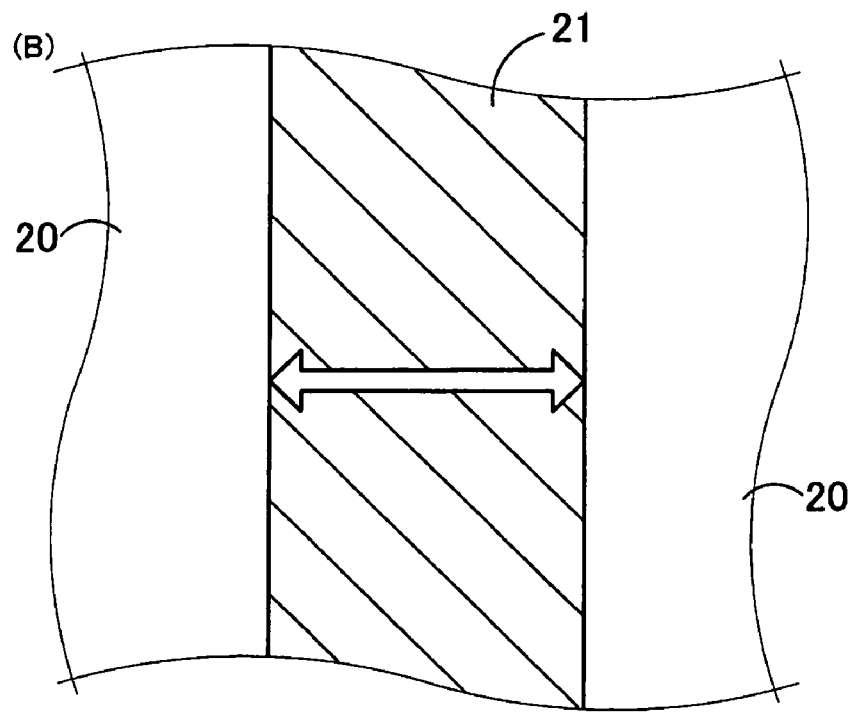

FIGS. 7A and 7B are views for describing determination of line width. FIG. 7A shows space determination. FIG. 7B shows line determination.

Usually line width determination includes space determination and line determination. With space determination, the width of a light transmitting portion 20 located between light shielding portions 21 is determined as shown in FIG. 7A. With line determination, the width of the light shielding portion 21 located between the light transmitting portions 20 is determined as shown in FIG. 7B.

As shown in FIGS. 6A and 6B, compared with the case where charge-up does not occur, the pattern edges of the light transmitting portion 20 look thick in space determination in the case where charge-up occurs. As a result, there is a strong possibility that a value obtained by determining the width of the light transmitting portions 20 is smaller than the correct value.

Similarly, compared with the case where charge-up does not occur, the pattern edges of the light transmitting portions 20 between which the light shielding portion 21 located look thick in line determination in the case where charge-up occurs. As a result, there is a strong possibility that a value obtained by determining the width of the light shielding portions 21 is greater than the correct value.

As stated above, the line width of a pattern is not necessarily determined with accuracy by determining line width directly from a SEM image. In addition, usually it is difficult even to judge whether the line width of a pattern is determined with accuracy.

Accordingly, in the pattern line width evaluation method using the mask pattern 1, the line width of a plurality of areas in the pattern 2 to be determined each of which is located between a pair of surrounding patterns with an aperture rate different from that of another pair of surrounding patterns is determined. For example, the line width of three areas in the pattern 2 to be determined located between a pair of surrounding patterns 3 with an aperture rate of 0%, a pair of surrounding patterns 5 with an aperture rate of 50%, and a pair of surrounding patterns 7 with an aperture rate of 100%, respectively, is determined.

As described above, the line width of the pattern 2 to be determined becomes constant by using the formation method devised. Therefore, if results obtained by determining the line width of the areas located between the pairs of surrounding patterns with the different aperture rates are the same, then there is no charge-up. If results obtained by determining the line width of the areas located between the pairs of surrounding patterns with the different aperture rates are not the same, then there is charge-up. As a result, it is possible to judge whether the line width of the pattern 2 to be determined is determined with accuracy.

A result obtained by determining the line width of each area is used, the determination accuracy of the SEM itself is considered, and the amount of a determination error caused by the charge-up is calculated.

The method for evaluating pattern line width according to the present invention will now be described by giving a concrete example.

A mask pattern formed by a metal film of Cr with a thickness of 73 nm is used as the mask pattern 1. As stated above, the mask pattern 1 includes the pattern 2 to be determined with a line width of about 400 nm and a length of about 3 μm and the five surrounding patterns 3, 4, 5, 6, and 7 with aperture rates of 0%, 25%, 50%, 75%, and 100% respectively.

In the method for evaluating pattern line width using the mask pattern 1, observations by a SEM are made with an acceleration voltage of 1.5 keV and an irradiation current of 7 pA. The line width of three areas a, b, and c (see FIG. 1) in the pattern 2 to be determined located between the pair of surrounding patterns 3 with an aperture rate of 0%, the pair of surrounding patterns 5 with an aperture rate of 50%, and the pair of surrounding patterns 7 with an aperture rate of 100%, respectively, is determined.

Figure 8:
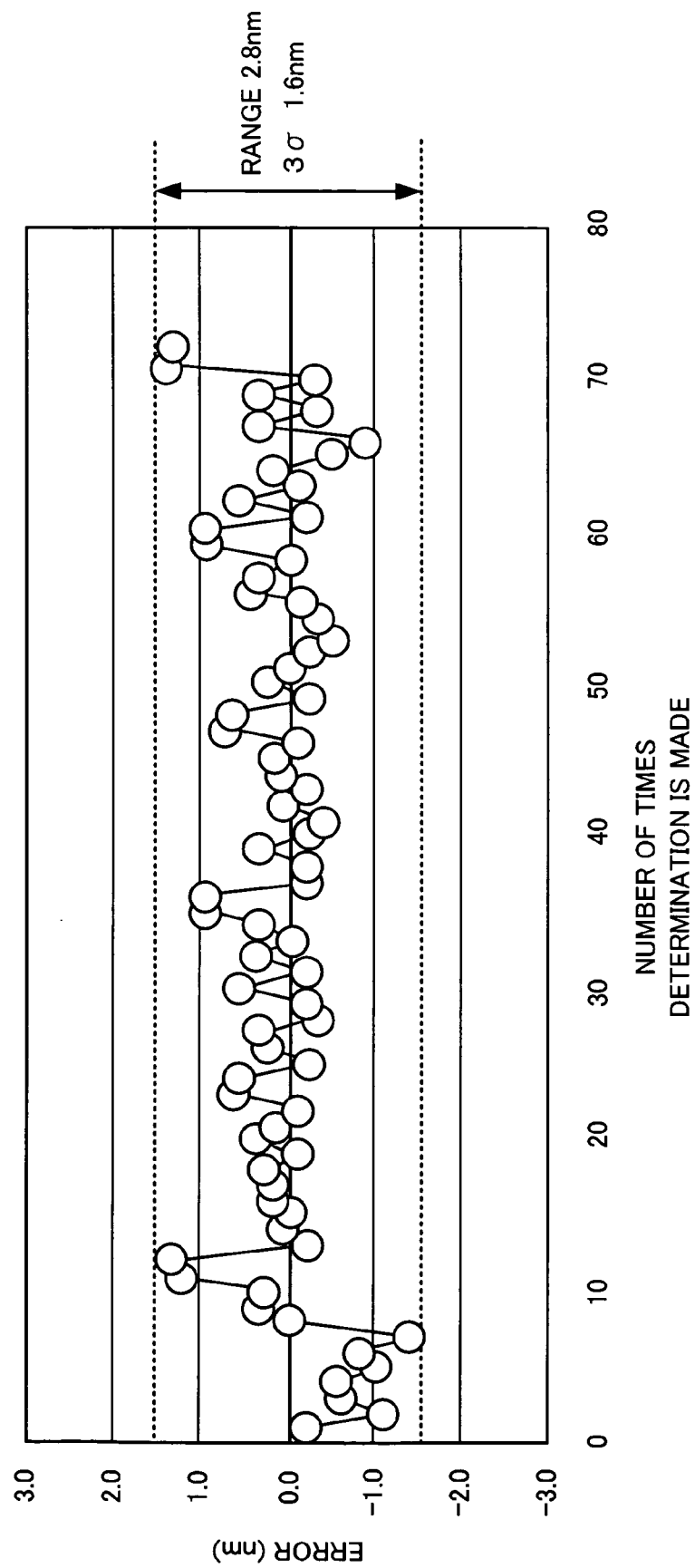
Figure 9:
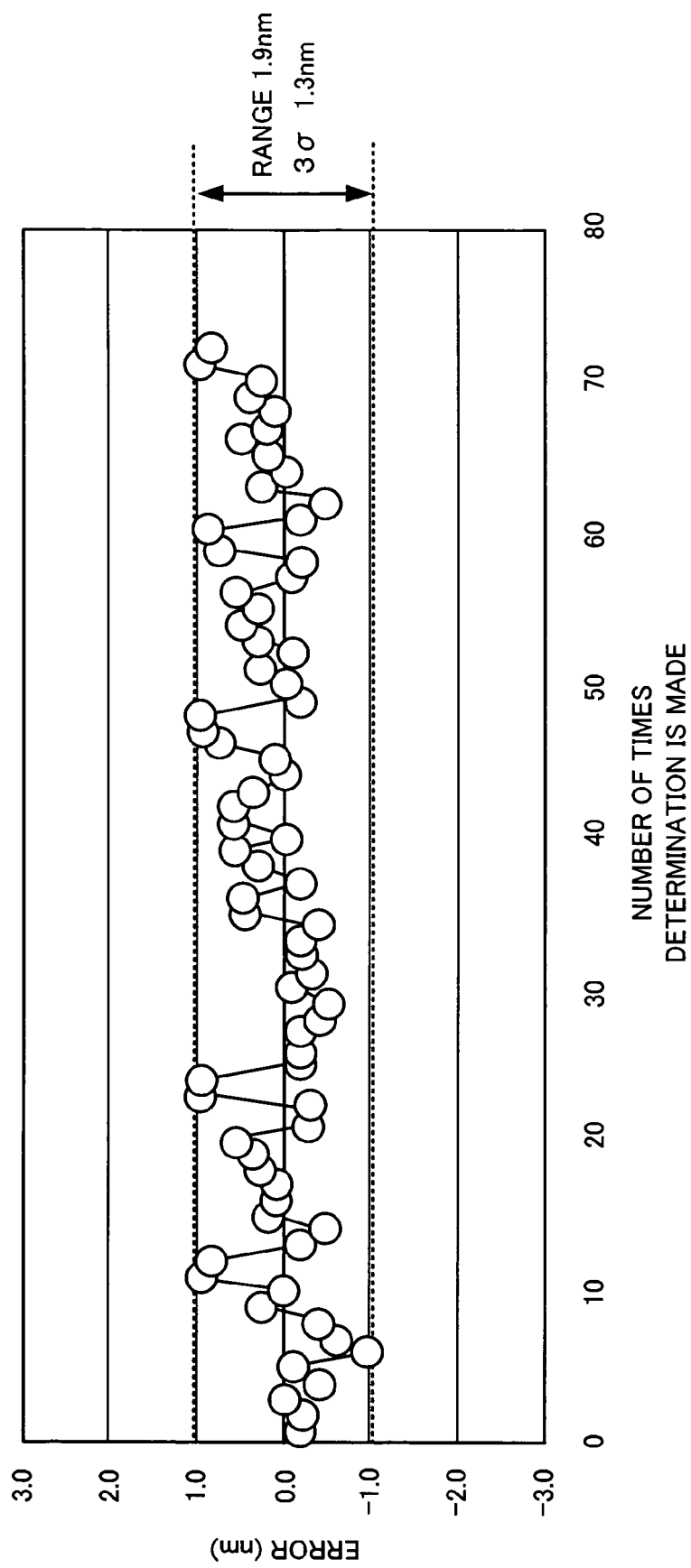
FIG. 9 is a view showing results obtained by determining the line width of an area b.
Figure 10:
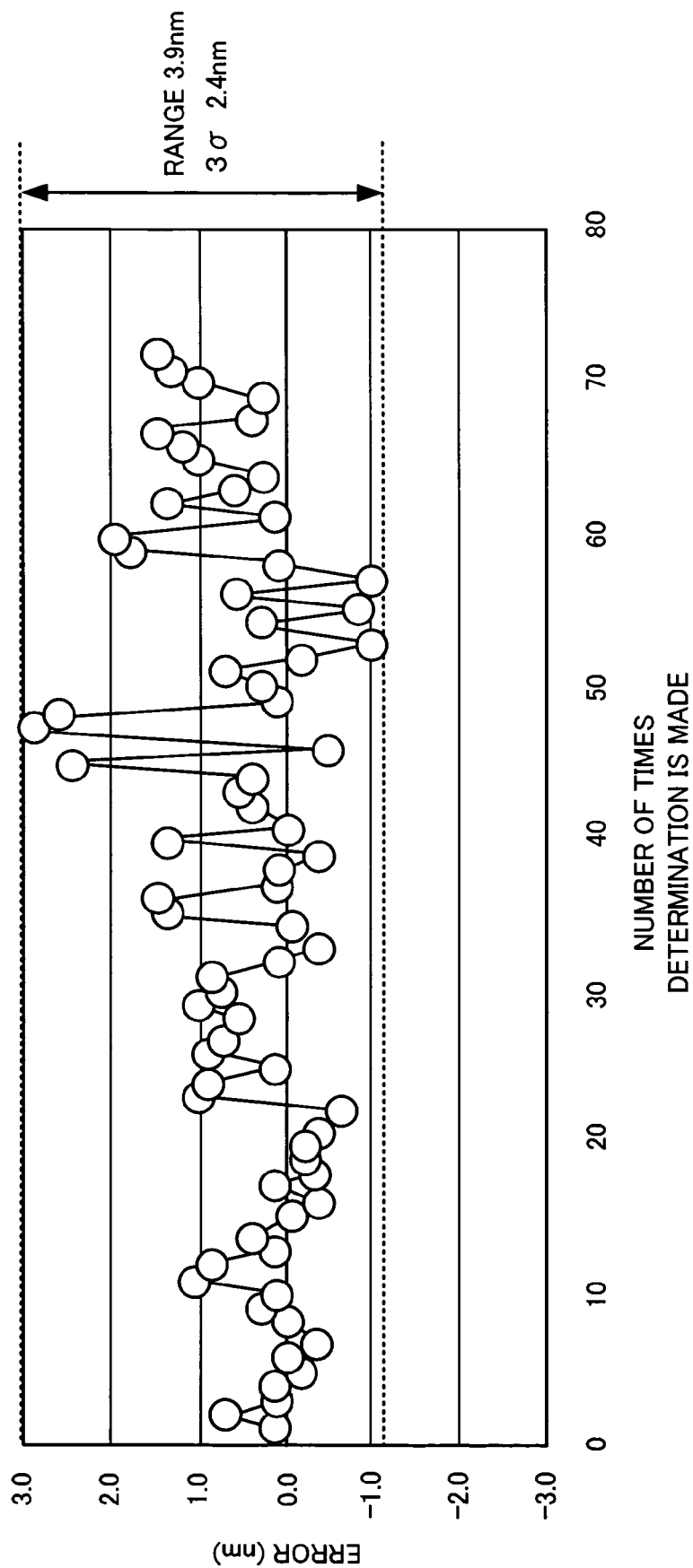
FIG. 10 is a view showing results obtained by determining the line width of an area c.

FIG. 8 is a view showing results obtained by determining the line width of the area a. FIG. 9 is a view showing results obtained by determining the line width of the area b. FIG. 10 is a view showing results obtained by determining the line width of the area c.

In each of FIGS. 8 through 10, a horizontal axis indicates the number of times determination is made and a vertical axis indicates an error (in nanometers) which occurs in determination of the line width of the area a, b, or c. In this example, the designed line width of the pattern 2 to be determined is 400 nm. The error 0.0 nm on the vertical axis corresponds to the designed line width of the pattern 2 to be determined. As shown in FIGS. 8 through 10, determination of line width is performed repeatedly in order to clarify effects.

As can be seen from FIGS. 8 through 10, by repeatedly determining the line width of the areas a, b, and c, results obtained vary to a certain extent. In addition, though the line width of the formed pattern 2 to be determined is constant, an error range and error variation differ among the areas a, b, and c.

As shown in FIG. 8, in the case where the line width of the area a is determined, an error range is 2.8 nm and an error variation is 1.6 nm, that is to say, 1.6 nm of the error range is within ±3σ. As shown in FIG. 9, in the case where the line width of the area b is determined, an error range is 1.9 nm and an error variation is 1.3 nm, that is to say, 1.3 nm of the error range is within ±3σ. As shown in FIG. 10, in the case where the line width of the area c is determined, an error range is 3.9 nm and an error variation is 2.4 nm, that is to say, 2.4 nm of the error range is within ±3σ. As can be seen from these values, the relationship "area b<area a<area c" exists as to an error range and error variation.

In other words, if the surrounding pattern 3 with an aperture rate of 0% or the surrounding pattern 7 with an aperture rate of 100% is near the pattern 2 to be determined, the influence of charge-up is great. Especially if the surrounding pattern 7 with an aperture rate of 100% is near the pattern 2 to be determined, the influence of charge-up is greater. If the surrounding pattern 5 with an aperture rate of 50% is near the pattern 2 to be determined, the influence of charge-up is not great. The reason for this will be that the number of secondary electrons emitted from the area b located between the pair of surrounding patterns 5 with an aperture rate of 50% balances the number of secondary electrons detected by the SEM.

It is assumed that the error range and the error variation obtained for the area b are considered to be the original determination accuracy of the SEM. Then the amount of a determination error caused by a charge-up of the area a or c can be found by comparing the determination results obtained for the area a or c with the determination results obtained for the area b.

For example, when the determination results obtained for the area a are compared with the determination results obtained for the area b, the difference in error range between the areas a and b is 0.9 nm (=2.8 nm−1.9 nm) and the difference in error variation between the areas a and b is 0.3 nm (=1.6 nm−1.3 nm). These values correspond to the amount of a determination error caused by a charge-up of the area a. Similarly, when the determination results obtained for the area c are compared with the determination results obtained for the area b, the difference in error range between the areas c and b is 2.0 nm (=3.9 nm−1.9 nm) and the difference in error variation between the areas c and b is 1.1 nm (=2.4 nm−1.3 nm). These values correspond to the amount of a determination error caused by a charge-up of the area c.

As described above, the surrounding patterns 3, 5, and 7 with the different aperture rates are formed near the pattern 2 to be determined and the line width of the areas a, b, and c in the pattern 2 to be determined is determined. The error range and the error variation for the area b (with an aperture rate of about 50%) which are the narrowest are considered to be the determination accuracy of the SEM. The difference between the error range for the area b and the error range for the area a or c and the difference between the error variation for the area b and the error variation for the area a or c are found. By doing so, the amount of a determination error caused by a charge-up of the area a or c can be obtained as numeric values. Accordingly, it is possible to judge whether the line width of the pattern 2 to be determined is determined with accuracy.

In the above example, the line width of the three areas in the pattern 2 to be determined located between the pair of surrounding patterns 3 with an aperture rate of 0%, the pair of surrounding patterns 5 with an aperture rate of 50%, and the pair of surrounding patterns 7 with an aperture rate of 100% is determined in order to calculate the amount of a determination error caused by charge-up. However, it is a matter of course that the line width of the five areas in the pattern 2 to be determined located between the pair of surrounding patterns 3 with an aperture rate of 0%, the pair of surrounding patterns 4 with an aperture rate of 25%, the pair of surrounding patterns 5 with an aperture rate of 50%, the pair of surrounding patterns 6 with an aperture rate of 75%, and the pair of surrounding patterns 7 with an aperture rate of 100% may be determined in order to calculate the amount of a determination error caused by charge-up. In this case, the error range and the error variation for the area (with an aperture rate of about 50%) which are the narrowest are also used as standards. Then the difference between the error range for this area and an error range for another area and the difference between the error variation for this area and an error variation for another area are found. By doing so, the amount of a determination error caused by charge-up should be calculated.

If the aperture rate of surrounding patterns (in the above example, the aperture rate 50% of the surrounding patterns 5 formed on both sides of the area b) that make a range of and a variation in errors in line width determined with the SEM the narrowest is known, then at least two kinds of surrounding patterns, that is to say, surrounding patterns with that aperture rate and surrounding patterns with another aperture rate (which may be the surrounding patterns with an aperture rate of 0%) should be formed. By doing so, the amount of a determination error caused by charge-up can be calculated. Accordingly, it is possible to judge whether the line width of the pattern 2 to be determined is determined with accuracy.

As described above, by forming the above-mentioned mask pattern 1 on the photo mask, the amount of a determination error caused by charge-up which may occur at the time of determining the line width of the pattern 2 to be determined with an electron microscope can be found quantitively.

According to the above-mentioned method for evaluating pattern line width, the amount of a determination error caused by charge-up can be found easily and whether pattern line width is determined with accuracy can be judged. This enables stable determination of pattern line width by an electron microscope. In addition, this enables short- and long-term management of the amount of a determination error caused by charge-up which may occur as a result of using an electron microscope, a comparison of the amount of determination errors caused by charge-up in the case of using electron microscopes manufactured by different companies or electron microscopes of different types, and the like.

The above description has been given with the case where the line width of the mask pattern formed on the photo mask is evaluated as an example. However, the present invention is not limited to such a case. That is to say, the present invention is widely applicable to circuit patterns formed on devices, such as semiconductor devices, wiring patterns formed on printed circuit boards, or the like the line width of which is evaluated with an electron microscope by forming a pattern like the above-mentioned mask pattern 1.

In the present invention, the mask pattern in which each of a plurality of areas in the pattern to be determined with the same line width is located between a pair of surrounding patterns with the same aperture rate and in which the aperture rate of a pair of surrounding patterns between which one of the plurality of areas in the pattern to be determined is located differs from the aperture rate of a pair of surrounding patterns between which another one of the plurality of areas in the pattern to be determined is located is formed on the mask. In this case, surrounding patterns with different aperture rates exist near areas with the same line width. Therefore, by finding the difference between the line width values of these areas obtained by determination with an electron microscope, the amount of a determination error caused by charge-up can be calculated. As a result, the line width of the pattern to be determined can be evaluated properly.

Furthermore, in the present invention, to form a pattern for a line width evaluation, the pattern to be determined the line width of which is to be determined is formed first and then the surrounding patterns with the predetermined aperture rates are formed at the predetermined positions near the pattern to be determined. As a result, the pattern to be determined including areas with the same line width can be formed with great accuracy. Accordingly, the amount of a determination error caused by charge-up can be evaluated properly at the time of determining line width with an electron microscope.

In addition, in the present invention, the surrounding patterns with the different aperture rates are formed near the pattern to be determined including areas with the same line width, the line width of each area in the pattern to be determined is determined with an electron microscope, line width values obtained are compared, and the line width of the pattern to be determined is evaluated. As a result, the amount of a determination error in the line width of the other areas caused by charge-up can be found with the line width of one area as a standard and whether line width is determined with accuracy can be judged.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A mask with a mask pattern including a pattern to be determined the line width of which is to be determined and a plurality of surrounding patterns formed near the pattern to be determined, wherein:
   the pattern to be determined has a plurality of areas with each having the same line width, each of the plurality of areas located between a pair of surrounding patterns with a same aperture rate among the plurality of surrounding patterns; and
   an aperture rate of one pair of surrounding patterns among the plurality of surrounding patterns differs from an aperture rate of another pair of surrounding patterns among the plurality of surrounding patterns.

2. The mask according to claim 1, wherein the pattern to be determined is a line pattern.

3. The mask according to claim 1, wherein one pair of surrounding patterns among the plurality of surrounding patterns has an aperture rate of 50%.

4. The mask according to claim 1, wherein light transmitting portions and light shielding portions are arranged like a mosaic in the plurality of surrounding patterns except surrounding patterns with aperture rates of 0% and 100% so that predetermined aperture rates will be obtained.

5. A patterning method for forming a pattern, the method comprising:
   forming a pattern to be determined the line width of which is to be determined; and
   forming a pair of surrounding patterns with a same aperture rate near the pattern to be determined after the formation of the pattern to be determined, the pattern to be determined being located between the pair of surrounding patterns;
   wherein the case of forming the surrounding patterns, a plurality of pairs of surrounding patterns are formed near the pattern to be determined after the formation of the pattern to be determined, each pair having a same aperture rate, the pattern to be determined having a plurality of areas with each having the same line width, each of the plurality of areas being located between each of the plurality of pairs of surrounding patterns; and
   wherein when the plurality of pairs of surrounding patterns are formed near the pattern to be determined after the formation of the pattern to be determined, the plurality of pairs of surrounding patterns are formed so that an aperture rate of one pair of surrounding patterns will differ from an aperture rate of another pair of surrounding patterns.

6. A line width evaluation method for evaluating the line width, the method comprising:
   forming a plurality of pairs of surrounding patterns each of which have a same aperture rate, each of the plurality of pairs of surrounding patterns having therebetween each of a plurality of areas of a pattern to be determined, the plurality of areas each having the same line width;
   determining line width of the pattern to be determined in each of the plurality of areas located between each of the plurality of pairs of surrounding patterns by using an electron microscope; and
   using the line width of one area of the plurality of areas as a standard, comparing the line width of another area of the plurality of areas with the line width of the one area of the plurality of areas, and finding an amount of a determination error in the line width of the another area of the plurality of areas caused by charge-up; and
   wherein the case of forming the plurality of pairs of surrounding patterns, the plurality of pairs of surrounding patterns are formed so that an aperture rate of one pair of surrounding patterns will differ from an aperture rate of another pair of surrounding patterns.

7. The line width evaluation method according to claim 6, wherein the case of using the line width of the one area of the plurality of areas as a standard, comparing the line width of the another area of the plurality of areas with the line width of the one area of the plurality of areas, and finding the amount of a determination error in the line width of the another area of the plurality of areas caused by charge-up, a difference between the line width of the another area and the line width of the one area is calculated and the difference is considered to be the amount of a determination error caused by charge-up.

* * * * *